United States Patent [19]
Martin et al.

[11] Patent Number: 4,937,472
[45] Date of Patent: Jun. 26, 1990

[54] SAMPLING-HOLDING CIRCUIT WITH HIGH SAMPLING FREQUENCY

[75] Inventors: Philippe Martin, Issy les Moulineaux, France; Jean-Pierre Polonovski, Chippewa Falls, Wis.

[73] Assignees: Thomson Semiconducteurs; Centre National de la Recherche Scientifique, both of Paris, France

[21] Appl. No.: 103,688

[22] Filed: Oct. 2, 1987

[30] Foreign Application Priority Data

Oct. 3, 1986 [FR] France .................................. 86 13848

[51] Int. Cl.⁵ ...................... H03K 17/74; G11C 27/02
[52] U.S. Cl. ...................................... 307/353; 307/257
[58] Field of Search ............... 307/257, 321, 352, 353, 307/572, 573

[56] References Cited

U.S. PATENT DOCUMENTS

| | | | |
|---|---|---|---|
| 3,584,920 | 6/1971 | Sills | 307/257 |
| 3,721,829 | 3/1973 | Benson | 307/352 |
| 4,518,921 | 5/1985 | Logan | 307/353 |
| 4,634,993 | 1/1987 | Koen | 307/353 |
| 4,659,945 | 4/1987 | Metz | 307/353 |
| 4,728,819 | 3/1988 | Vu | 307/353 |

*Primary Examiner*—John Zazworsky
*Attorney, Agent, or Firm*—Oblon, Spivak, McClelland, Maier & Neustadt

[57] ABSTRACT

An ultra-fast sample-and-hold circuit for the processing of analog signals comprises a diodes bridge: an input signal VE is applied to the input point and copied at the output point; the output signal is memorized in a capacitance. At the midpoints of the bridge, two current sources are applied. The voltages at the midpoints are servo-linked, in the hold mode, to the output voltage by means of a voltage follower and diodes mounted diagonally across the bridge, the two switches of the current sources being controlled by a signal clock signal. It is applied to signal processing chains in instrumentation, radar and telecommunications.

9 Claims, 2 Drawing Sheets

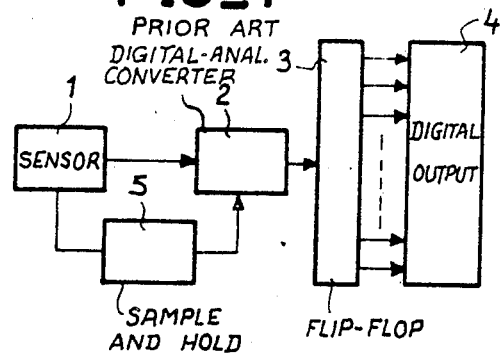
FIG_1 PRIOR ART
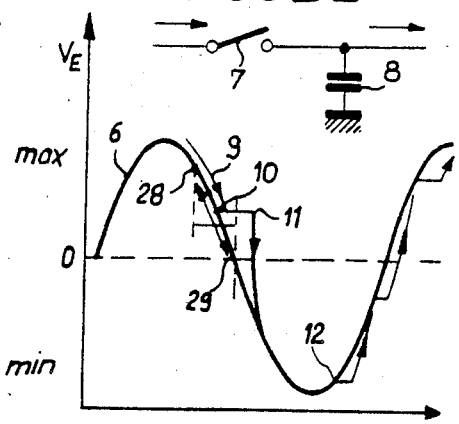
PRIOR ART FIG_2
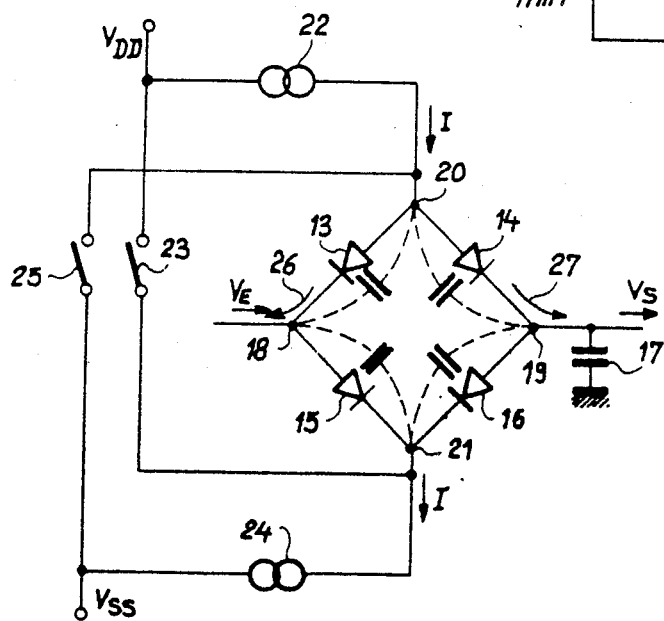
FIG_3 PRIOR ART
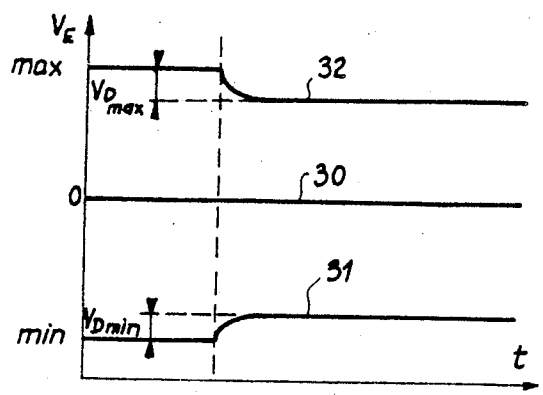
FIG_4

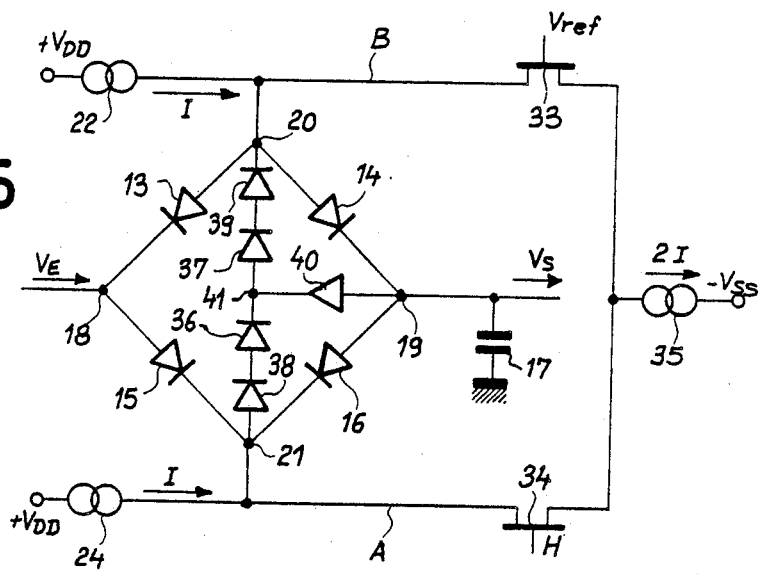
FIG_5
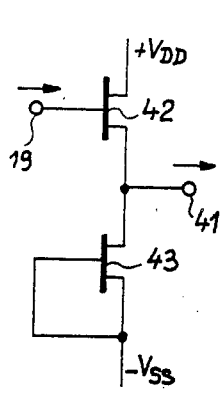
FIG_6
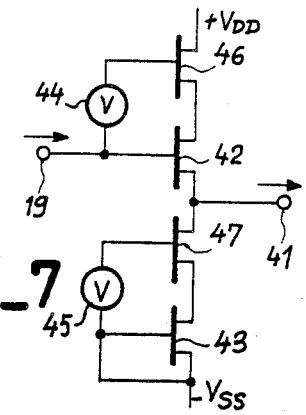
FIG_7
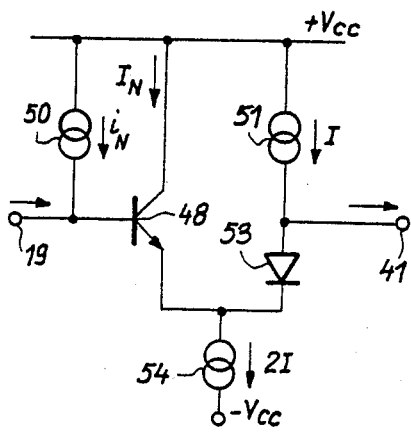
FIG_8
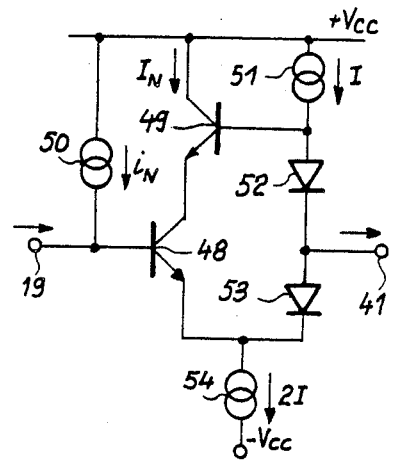
FIG_9

SAMPLING-HOLDING CIRCUIT WITH HIGH SAMPLING FREQUENCY

BACKGROUND OF THE INVENTION

1. Field of the Invention

The present invention pertains to a fast electronic circuit designed to process information in a signal-processing chain. More precisely, it pertains to a sample-and-hold circuit which is preferably made in the form of an integrated circuit, on silicon or fast-acting materials of the group III-V, such as GaAs for example.

The scope of this sample-and-hold circuit ranges from relatively low frequencies (a few megahertz) to about 1 GHz. This sample-and-hold circuit has been developed and perfected for high frequencies, but its design does not prevent the device from being used at lower frequencies. The device is of the diodes bridge type.

2. Description of the Prior Art

A sample-and-hold circuit is used in a signal-processing chain such as the one shown in FIG. 1. There are two possible ways to transform the analog signal given by a sensor 1 into a digitalized signal. The first way is to transform the analog signal with an analog-digital converter (ADC) 2 and then to periodically memorize the digital signals given by the ADC. The output of the flip-flop 3 gives a digital signal at 4, in a certain number of bits, depending on the precision sought.

The second way is to interpose a sample-and-hold circuit 5 between the sensor 1 and the ADC 2. This sample-and-hold circuit can be likened to a switch followed by a capacitor: when the switch is open, the voltage at its output terminal is memorized in the capacitor for a period of time which, ideally, depends only on the clock frequency that controls the opening and closing of the switch but which, in practice, depends on the value of the storage capacity and on the constraints (current leakages) related to the technology used. The voltage of the analog signal, coming from the sensor 1, is sampled by the sample-and-hold circuit 5 and digitalized by the analog-digital converter 2.

Sample-and-hold circuits are valuable because of their simplicity, which favours monolithic integration. However, the speed and precision of present-day models is below that of the best ADCs of the flash type. The limitations arise chiefly from stray signals induced by the clock signal at the holding instant and by the input signal in the "hold" mode. The choice of a high storage capacity to reduce these phenomena would imply a reduction of the sampling frequency, namely a reduction in the width of the pass-band. Thus there is a conflict of goals between speed and precision.

These disadvantages have two causes. Firstly, as we shall see further below, sample-and-hold circuits of the prior art are controlled by two switches. It is difficult to synchronize the two clock switches which are subjected to different potential sweeps. In practice, such synchronization requires two separate commands which are not perfectly synchronized. Secondly, a difference in potential sweeps at the terminals of the diodes bridge, during the hold mode, causes an input of voltage into the bridge, depending on the value of the input signal.

SUMMARY OF THE INVENTION

To remove these disadvantages, the invention relies on two new principles:

it uses only one clock signal to hold the bridge output voltage, it sets up a servo-link system between the voltage sweeps at the terminals of the bridge and the output voltage during the holding period.

More precisely, the invention pertains to a sample-and-hold circuit with a high sampling frequency, comprising a diodes bridge that has an input point at which an input analog signal is applied, an output point at which an output signal, memorized in a storage capacitance, is collected and two midpoints at which the currents of two current sources, controlled by two switches, are forced, namely a sample-and-hold circuit:

comprising means by which the voltage of the two midpoints, in the hold mode, is servo-controlled at a constant value with reference to the output voltage: $V_S - K$ for the "upper" midpoint and $V_S + K$ for the "lower" midpoint, and wherein the switches controlling the two current sources are activated by a single clock signal.

BRIEF DESCRIPTION OF THE DRAWINGS

The invention will be better understood from the following detailed description of an example of an embodiment, made with reference to the appended drawings, of which:

FIG. 1 is an analog-signal processing chain, already described;

FIG. 2 is a diagram showing the sampling of a signal according to the prior art;

FIG. 3 is an electrical diagram of a sample-and-hold circuit according to the prior art;

FIG. 4 is a graph showing the variations in the sampled signal as a function of the sampling instant with respect to the amplitude of the input signal;

FIG. 5 is an electrical diagram of a sample-and-hold circuit according to the invention.

FIGS. 6 and 7 are diagrams of two types of voltage followers using field-effect transistor technology;

FIGS. 8 and 9 are diagrams of a voltage follower using bipolar transistor technology.

DESCRIPTION OF THE EMBODIMENTS

A preliminary description of the sampling of an analog signal and of a sample-and-hold circuit of the prior art will give a clearer understanding of the phenomena entailed and the means used in the invention to correct the said phenomena.

FIG. 2 shows the variation of the voltage V, in time t, of an analog signal represented by the curve 6 which has a mean value of 0 and develops between a maximum (max) and a minimum (min). A sample-and-hold circuit may be likened to a switch 7, followed by a capacitance 8. The sample-and-hold circuit is shown above the curve 6. The signal to be sampled goes through the sample-and-hold circuit. So long as the switch 7 is closed, the sampler follows the variation of the signal at 9. At a given instant, at 10 for example, the switch 7 is open: the output voltage of the switch is stored in the capacitance 8, hence it is kept constant and sampled for a period of time up to 11. At this instant, the switch 7 is closed again, the sampler catches up with the signal 6 and then follows it until the instant 12 when the signal is again sampled. The operation continues in this way. It is shown that the sampling frequency should be greater than twice the maximum frequency of the signal.

In reality, the sample-and-hold circuit of the prior art is built according to the electrical diagram of figure 3.

The "switch" is formed by a diodes bridge 13 to 16 and is followed by a capacitance 17. The input signal $V_E$ is applied at a first point 18 of the diodes bridge and the output signal $V_S$ is collected at second point 19 of the bridge, the said point 19 being diametrically opposite to the point 18. Two current sources are applied at the third and fourth points 20 and 21 respectively of the diodes bridge. The source 22 forces a current I through the bridge and may be cut off by a switch 25. The source 24 draws a current I from the bridge and can be cut off by a switch 23.

When the switches 23 and 25 are open and when the current sources 22 and 24 deliver current from the point 20 towards the point 21 (of course, the diodes 13 to 16 are properly mounted for this purpose), the current is divided between a first channel (diodes 13 and 15) and a second channel (diodes 14 and 16): the potentials are balanced, the voltages at the points 18 and 19 are the same, the output of the bridge copies the input and $V_S = V_E$. The bridge follows the variations of the input voltage $V_E$.

When the switches 23 and 25 are closed, the current no longer flows through the bridge from the point 20 towards the point 21. The input signal $V_E$ can no longer cross the bridge because, whatever its polarity, there are always two reverse-polarized diodes, 13 and 16 or 14 and 15. The diodes bridge is equivalent to an open switch and the output voltage $V_S$ is stored in the capacitance 17 and is measured or digitalized by an ADC.

In practice, the output voltage $V_S$ does not exactly copy the input voltage $V_E$ for the reasons already cited.

First of all, when the bridge is blocked, each diode, seen in reverse, behaves like a capacitance (shown with dashes in FIG. 3) and the diodes bridge is equivalent to a capacitance. The variations of the input signal $V_E$, which is an analog signal, are transmitted through this equivalent capacitance and modify the value of $V_S$, for the equivalent capacitance and the capacitance 17 constitute a capacitive divider. In the hold mode, the input signal $V_E$ thus disturbs the output signal $V_S$ stored in the capacitance 17.

After this, it is necessary to have two current sources 22 and 24, one source forcing a current through the bridge and the other source drawing this current from the bridge. If there were only one source, 22 for example, it could inject a current towards the sensor which gives the input signal $V_E$, in a path symbolized by the arrow 26, and a current towards the capacitance, in a path symbolized by the arrow 27, thus modifying $V_S$. It is therefore necessary to extract the current injected by means of the source 24. But if there are two current sources 22 and 24, there are two switches 23 and 25, and it is known that two switches cannot function almost simultaneously.

Thus, referring to FIG. 2, the uncertainty relating to the closing time of the switches means that, instead of the signal $V_E$ being sampled at the point 10 for example, a first switch is closed at the point 28 and a second switch is closed at the point 29. During this period of uncertainty, the diodes bridge is neither open nor closed: the difficulty in synchronizing the clocks of the two switches thus induces stray signals which disturb the signals $V_E$ and $V_S$ and do not comply with the symmetry of the bridge between its input and output points 18 and 19 respectively.

Finally, with a sample-and-hold circuit according to FIG. 3, the value of $V_S$ varies according to the sampling moment with respect to the maximum and minimum values of the signal $V_E$.

We shall now consider, in FIG. 4, the signal $V_E$ which varies, around a mean value of 0, in the period of time t between a positive maximum max and a negative minimum min.

If the bridge is blocked when the signal $V_E$ passes through 0, the point 20 of the bridge is at a voltage $-V_{SS}$, the point 21 is at a voltage $V_{DD}$: the voltage sweeps become balanced. When the bridge becomes blocked, the potential of the points 20 and 21 do not cause any disturbance if $V_{SS} = V_{DD}$, as shown by the curve 30 in FIG. 4.

If the bridge is blocked when $V_E$ is at the minimum or close to its minimum, there is an imbalance between the point 21 at $V_{DD}$ and the point 20 at $-V_{SS}$ with respect to the memorized voltage. When the bridge is blocked, the potentials of the points 20 and 21 modify the potential of the point 19, through the capacitances of the diodes, and this modification is seen in the broken curve 31.

If the bridge is blocked when $V_E$ is at the maximum or near its maximum, a similar form of reasoning shows that the broken curve 32 also corresponds to a disturbance in the measurement of $V_E$.

The potentials of the points 20 and 21 must therefore be fixed at voltages that are symmetrical with respect to the output potential $V_S$ when the bridge is blocked.

The sampling-holding circuit according to the invention removes the disadvantages just described by:

servo-linking the voltages at the two "midpoints" 20 and 21 of the diodes bridge to the voltage of the output point 19, in order to servo-control the voltage sweeps, controlling the two switches of the current sources by means of a single clock signal to block the bridge output voltage.

This is shown in FIG. 5. For an easier comparison with the sample-and-hold circuit of FIG. 3, the same references are used for the same elements.

The sample-and-hold circuit of the invention comprises a bridge of diodes 13 to 16, comprising an input point 18 to which the signal to be processed $V_E$ is applied, an output point 19 at which the output signal $V_S$, stored in a capacitance 17, is collected and two "midpoints" 20 and 21. A first current source 22 is connected to the "upper" midpoint 20, common to the diodes 13 and 14: this source 22 is powered by the voltage source $V_{DD}$ and delivers a current I. A second current source 24 is connected to the "lower" midpoint 21, common to the diodes 15 and 16: this source 24 is powered by a voltage source $V_{DD}$ and delivers a current I equal to the current of the source 22.

The switches of the current sources 22 and 24 are formed by two transistors 33 and 34 mounted as a single differential pair. The first transistor 33 is mounted between the "upper" common point 20 and a current source 25, joined at $-V_{SS}$, which "draws" a current equal to 2 I. A reference direct voltage $V_{Ref}$ is applied to the control electrode of the transistor 33, i.e. to the gate if it is a field-effect transistor and to the base if it is a bipolar transistor. The second transistor 34 is mounted symmetrically between the "lower" common point 21 and the current source 35. A square-wave clock voltage H is applied to its control electrode. The clock voltage H is sometimes greater than the reference voltage $V_{Ref}$ and sometimes "lower" than it, so that the transistor 34 is sometimes more conductive and sometimes less conductive than the transistor 33.

In the diodes bridge itself, an even-numbered plurality of diodes is mounted diagonally across the bridge, between the "midpoints" 20 and 21 in such a way that these diodes are directly polarized when the diodes 13 to 16 of the bridge are reverse polarized. Depending on the characteristics sought, two diodes 36 and 37 or four diodes 36+38 and 37+39 or more diodes are diagonally mounted, but the mounting is always done symmetrically (hence in pairs) with respect to a point of symmetry 41.

Finally, a voltage follower 40 measures the output voltage $V_S$ at the output point 19 of the diodes bridge, and copies it at the point symmetry 41. Thus the potential at the two midpoints, the "upper" midpoint 20 and the "lower" midpoint 21 is servo-linked, in the hold mode, to the output voltage $V_S$ at the point 19. The voltage at the "upper" midpoint 20 is equal to $V_S-K$, and the voltage at the "lower" midpoint 21 is equal to $V_S+K$, with $K=nV_D$, n being the number of series-mounted diodes between 41 and 20 or between 21 and 41, $V_D$ being the voltage drop of a diode 36 to 39.

This sample-and-hold circuit works as follows.

In the follower mode, the clock voltage H, at the control electrode of the transistor 34, is greater than the direct voltage $V_{Ref}$ at the control electrode of the transistor 33: the transistor 34 is more conductive than the transistor 33. The current I given by the current source 22 flows through the bridge of diodes 13 to 16 and is added, in the circuit arm reference "A", to the current source 24. A current 2I flows through the transistor 34, and is extracted by the current source 35. The current I, which flows through the bridge, ensures equal potential between the input point 18 and the output point 19 of the bridge: $V_S=V_E$. During this phase, the diodes 36 to 39, mounted diagonally across the bridge, are reverse-polarized.

The bridge goes into "hold" mode when the clock voltage H becomes smaller than the direct voltage $V_{Ref}$, and the transistor 34 is off. There is no longer any uncertainty about the opening time of the switches 33 and 34, since there is only one clock signal H. In the "hold" mode, the current source 24 delivers a current I in the several diode pairs 36 to 39, mounted diagonally across the bridge. This current I is added, in the arm of the circuit reference B, to the current I given by the current source 22. A current 2I flows through the transistor 33 and is extracted by the current source 35.

The voltage follower 40 copies, at the point of symmetry 41, the output voltage $V_S$, stored in the capacitance 17 and picked up at the output point 19. And since the diodes 36 to 39, mounted diagonally across the bridge, are identical and have the same voltage drop $V_D$, the voltage, in "hold" mode, at the "upper" midpoint 20, is equal to output voltage $V_S$ diminished by as many times the voltage drop $V_D$ as there are diodes (37, 39) in a half-diagonal. Similarly, in the "hold" mode, the voltage at the "lower" midpoint 21 is equal to the output voltage $V_S$ increased by as many times the voltage drop $V_D$ as there are diodes (36, 38) in a half-diagonal. The voltages of the points 20 and 21 are therefore servo-linked, at a constant value, to the output voltage $V_S$ copied at the point of symmetry 41. In the case of the FIG. 5 (which does not limit the scope of the invention), since there are two diodes in each half-diagonal:

$$V_{20}=V_{41}-2V_D=V_S-2V_D$$

$$V_{21}=V_{41}+2V_D=V_S+2V_D$$

The servo-linking of the "upper" midpoint and the "lower" midpoint almost entirely eliminates the injection of the clock voltage into the bridge.

The dynamic range of this sample-and-hold circuit is determined by the conduction limit of the series-mounted diodes with reference to the input signal. Thus, between the point of symmetry 41, to which the output voltage $V_S$ is applied, and the input point 18, to which the input voltage $V_E$ is applied, the diodes 37 and 39 of a half-diagonal and the diode 13 of the bridge are mounted in the conductive direction. There are three diodes, and the dynamic range is therefore $$\pm \frac{3V_D}{2}.$$

More generally, if a series of 2n diodes is mounted diagonally across the bridge, the dynamic range is equal to $$\pm \frac{(n+1)}{2} V_D.$$

Assuming that the bridge comprises only one diode per branch: if the bridge were to comprise, for example, two series-mounted diodes such as 13 (or 14, or 15 or 16) in each of its arms, the dynamic range would be $$\pm \frac{(n+2)}{2} V_D.$$

This dynamic range can be increased by acting on the number of diodes (an even number) mounted diagonally across the bridge. Besides, the said diodes can more generally be replaced by polarized voltage sources.

Earlier, in the introduction describing the disadvantages of sample-and-hold circuits, we have shown that the symmetry of the voltage sweeps at the "upper" and "lower" midpoints of the bridge, with respect to the output voltage stored in the capacitance, increases the rejection of the clock voltage. An assembly according to the invention, which ensures the total symmetry of the voltages at the midpoints 20 and 21 with the voltage at the point of symmetry 41, namely with the output voltage at the point 19, therefore gives an excellent rejection of the clock voltage.

An excellent rejection of the input signal is also given by the low impedance displayed by the voltage follower (which will be described in detail below) giving a reference to the point of symmetry 41 with respect to the output point 19. For the current injected through the capacitances of the reverse-polarized diodes bridge, in the "hold" mode, is reflected only in a low voltage sweep at the follower 40, and this voltage sweep has repercussions on the "upper" and "lower" midpoints of the bridge, forming a capacitive divider with the storage capacitance 17.

The switches 33 and 34, which control the current sources 22 and 24, consist of a differential pair of transistors which may be field-effect or bipolar transistors, made of silicon or gallium arsenide, depending on the frequencies considered. The important point is that the these two transistors should have identical characteristics in order to preserve the symmetry of the assembly. It is possible to consider controlling them with additional voltages from a comparator but this would entail the risk of not having the signal square waves perfectly superimposed, and this would mean a return to the difficulties of the prior art. This is why it is preferable to control only one transistor, 34, by a single square-wave clock signal which is sometimes greater and sometimes smaller than the direct voltage $V_{Ref}$ applied to the other transistor 33: thus there is no longer any uncertainty about the opening time.

An electrical diagram of the voltage follower 40 is given in FIG. 6. This follower simply consists of two identical enhanced field-effect transistors 42 and 53 ($V_T > 0$) series-mounted between two voltages $+V_{DD}$ and $-V_{SS}$. The input signal $V_S$, coming from the point 19 of the diodes bridge, is applied to the gate of the first transistor 42. The output signal, applied to the point of symmetry 41 of the diodes bridge, is picked up between the source of the first transistor 42 and the drain of the second transistor 43, the gate of which is connected to the source. But this assembly does not function as an ideal follower owing to the drain conductance of the transistors. Whereas an ideal voltage follower has a slope equal to 1 (it gives a faithful copy, at 41, of the voltage at 19), this assembly has a slope of about 0.8, , leading to a slight offset in the bridge, between the points 19 and 41.

A slope nearer to 1 is obtained with a cascode assembly for the voltage follower according to the figure 7. This voltage follower is similar to the previous one in the nature of the field-effect transistors, and it again has the two transistors 42 and 43. But their drain conductances are cancelled by two voltage sources 44 and 45: the voltage source 44 is connected between the gate of the first transistor 42 and the gate of an additional transistor 46, and the voltage source 45 is connected symmetrically between the gate of the second transistor 43 and the gate of another additional transistor 47. The four additional transistors 46, 42, 47 and 43 are series-mounted between $+V_{DD}$ and $-V_{SS}$. In fact, this voltage follower can be made with either four single-gate transistors or two two-gate transistors: one two-gate transistor to replace the transistors 42 and 46 and one two-gate transistor to replace the transistors 43 and 47. The making of the voltages sources 44 and 45 between gates is within the scope of the specialist, and can be done in different ways.

FIGS. 8 and 9 are electrical diagrams of a voltage follower 40 using bipolar technology. The diagram of figure 8 is not of the cascode type while that of FIG. 9 is of the cascode type. The working of this bipolar voltage follower will be explained with reference to the cascode assembly.

In FIG. 9, the signal to be copied, picked up at the point 19 of the diodes bridge, is applied to the base of a transistor 48. This transistor is powered from a voltage $+V_{CC}$, through a transistor 49, and its base current is compensated for by a current source 50. The transistor 49, mounted as a voltage follower, is controlled at its base by a current source 51.

Two diodes 52 and 53 are series-mounted between the base of the transistor 49 and the transmitter of the transistor 48. The current which flows through the:
the first arm formed by the two transistors 48 and 49, and
the second arm formed by the current source 51 and the two diodes 52 and 53,
is extracted by the current source 54 connected to a voltage source $-V_{CC}$. If $i_N$ is the current that flows through the source 50 (equal to the base current of the transistor 48), $I_N$ is the current flowing through the source transistor 49 and I is the current flowing through the source 51, the components are calculated so that:

$$i_N + I_N = I$$

and a current 2I is extracted by the source 54.

The diode 52 brings about a voltage drop which balances the one caused by the transmitter-base junction in the transistor 49. The diode 53 brings about a voltage drop which balances the one caused by the transmitter-base junction in the transistor 48. There is therefore a balance of currents and voltages in the two arms of this assembly: the voltage picked up at the point 41, between the two diodes 52 and 53, is equal to the voltage at the point 19, at the base of the transistor 48.

Like any device comprising transistors, the voltage followers exhibit a low leakage current. This leakage current is effective only at the maximum holding time which can be used by the sampling-holding circuit.

The performance characteristics of the sample-and-hold circuit according to the invention, using GaAs MESFET technology, with a storage capacity of 500 fF and currents of 3 mA for the current sources 22 and 24, are:
gain in follower mode 0,98,
resolution in six bits, i.e. about 1%,
sampling speed 500 MHz,
rejection of input signal <1% of the dynamic range,
uncertainty at opening ≃10 ps, compatible with signals at 1 GHz and a resolution of 6 bits.

These performance characteristics can be doubled by reducing the storage capacity by a factor of 2, at the cost of a less satisfactory rejection of the input signal.

Using bipolar technology, the performance characteristics are:
gain in follower mode≃1,
resolution in eight bits, i.e. about 0.25%,
sampling speed 100 MHz,
rejection of input signal 1 per thousand,
uncertainty at opening≃10–20 ps.

The sample-and-hold circuit according to the invention is designed for high-frequency analog signal processing chains, with a view to transforming the analog signals into digital signals. It is applicable, in particular, to instrumentation and to radar and telecommunications systems.

What is claimed is:
1. A sample-and-hold circuit with a high sampling frequency, comprising:
a storage capacitance;
a diodes bridge that has an input point to which an input analog signal is applied, an output point at which an output signal $V_S$, memorized in said storage capacitance, is collected, and first and second midpoints at which the currents of first and second current sources are applied;
first and second switches for controlling the flow of current applied to said midpoints by said current sources through said bridge;
control means by which the voltages of the midpoints, in a hold mode, is servo-controlled at a constant value K, with reference to the output signal $V_S$, wherein the first midpoint is servo-controlled to a voltage $V_S - K$ and the second mid- point is servo-controlled to a voltage $V_S+K$, comprising an even-numbered plurality of control diodes connected diagonally across the midpoints of the bridge with a polarity such that in the hold mode the control diodes are forward biased when the bridge diodes are reverse biased, and a voltage follower which feeds back the output signal $V_S$ memorized by the storage capacitance to a point of symmetry which divides the even-numbered control diodes into two equal numbers;

wherein said switches for controlling said current sources are activated by a single clock signal.

2. A sample-to-hold circuit according to the claim 1, wherein, if 2n designates the even-numbered plurality of diodes, and if $V_D$ designates the direct voltage drop through each of these diodes, the first midpoint of the bridge is servo linked to the voltage $V_S-nV_D$ and the second midpoint of the bridge is servo-linked to the voltage $V_S+nV_D$.

3. A sample-and-hold circuit according to the claim 1, wherein said first and second switches and said first and second current sources are connected between a first voltage source $(-V_{DD})$ and a second voltage source $(-V_{SS})$, as follows:

said first current source series-mounted with said first switch, the common point between the first current source and a first access electrode of the first switch being connected to the first midpoint of the diodes bridge, the second current source series-mounted with the second switch, the common point between the second current source and a first access electrode of the second switch being connected to the second midpoint of the diodes bridge, the second access electrodes of both said first and second switches being connected to each other and to a third current source which extracts the current given by the first and second current sources.

4. A sample-and-hold circuit according to claim 3, wherein said first and second switches comprise first and second transistors having identical characteristics and forming a differential pair, wherein a direct reference voltage is applied to the control electrode of the first transistor while a square-wave clock voltage is applied to control electrode of the second transistor, this voltage square wave being alternately greater than and smaller than the reference voltage.

5. A sample-and-hold circuit according to the claim 3, wherein, in the following mode:

the clock voltage at the second transistor is greater than the reference voltage at the first transistor, the current given by the first current source flows through the bridge diodes and is added, through the second transistor, to the current given by the second current source, the even-numbered pair of control diodes, mounted diagonally across the bridge, is reverse polarized, the potentials between the input and the output of the bridges being equal, the input voltage is copied at the output.

6. A sample-and-hold circuit according to the claim 4 wherein, in the hold mode, the clock voltage at the second transistor is smaller than the reference voltage at the first transistor, the current given by the second current source flows through the flows through the even-numbered pair of control diodes, mounted diagonally across the bridge, and is added, through the first transistor, to the current given by the first current source, the bridge diodes are reverse polarized, the output voltage $V_S$ memorized in the storage capacitance is copied by the voltage follower at the point of symmetry, at the midpoint of the diagonally-mounted control diodes, and servo-links the output voltage $V_S$ to the midpoint of the control diodes.

7. A sample-and-hold circuit according to the claim 1, wherein the voltage follower comprises first through fourth cascode-connected field-effect transistors series-mounted between two voltage sources, $+V_{DD}, -V_{DD}$, the output signal being applied to the gate of the second transistor, the output signal being picked up at the source of said second transistor, a first source of voltage connected between the gate of the first transistor and the gate of the second transistor, and a second voltage source, connected between the gate of the third transistor an the gate of the fourth transistor which, moreover, is connected to the source of the said fourth transistor.

8. A sample-and-hold circuit according to claim 1, wherein the voltage follower comprises:

two parallel arms connected between two voltage sources, $+V_{CC}$ and $-V_{CC}$, the first arm comprising a first following bipolar transistor powered by a second transistor mounted as a voltage follower, the base current of the first bipolar transistor being compensated for by a first current source, the second arm comprising a second current source which controls the base of the second bipolar transistor and two series-mounted diodes, the current delivered by the two arms being extracted by a third current source, the input point of the voltage follower being the base of the following transistor and the output point being the point common to the two diodes.

9. A sample-and-hold circuit according to the claim 1, with its dynamic ranged equal to half as many times the voltage drop of a diode as there are diodes between the point of symmetry and the diagonal of the bridge and a midpoint of the bridge, plus one diode:

$$D = \pm \frac{(n+1)}{2} V_D.$$

* * * * *